(12) United States Patent
Park

(10) Patent No.: US 7,990,174 B2
(45) Date of Patent: Aug. 2, 2011

(54) CIRCUIT FOR CALIBRATING IMPEDANCE AND SEMICONDUCTOR APPARATUS USING THE SAME

(75) Inventor: Nak Kyu Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/648,359

(22) Filed: Dec. 29, 2009

(65) Prior Publication Data

US 2010/0327903 A1 Dec. 30, 2010

(30) Foreign Application Priority Data

Jun. 30, 2009 (KR) .................. 10-2009-0058932

(51) Int. Cl.
*H03K 17/16* (2006.01)
(52) U.S. Cl. .......................... 326/30; 326/82
(58) Field of Classification Search .............. 326/30, 326/82, 83, 86, 87, 21, 26; 327/108; 341/120, 341/118

See application file for complete search history.

(56) References Cited

U.S. PATENT DOCUMENTS

| 7,477,083 B2 | 1/2009 | Fujisawa et al. | |
|---|---|---|---|
| 7,528,626 B2 | 5/2009 | Kim | |
| 7,773,440 B2 * | 8/2010 | Kim et al. | 365/201 |
| 2007/0132493 A1 | 6/2007 | Fujisawa et al. | |
| 2007/0148796 A1 | 6/2007 | Nakamura et al. | |
| 2008/0219068 A1 | 9/2008 | Kim et al. | |
| 2008/0304336 A1 | 12/2008 | Kim et al. | |
| 2009/0009212 A1 * | 1/2009 | Brox | 326/30 |

FOREIGN PATENT DOCUMENTS

| JP | 2007-116574 A | 5/2007 |
|---|---|---|
| JP | 2007-123987 A | 5/2007 |
| JP | 2008-219865 A | 9/2008 |
| JP | 2008-228276 A | 9/2008 |
| KR | 1020050100290 A | 10/2005 |
| KR | 10-0541557 B1 | 12/2005 |
| KR | 1020050118751 A | 12/2005 |

* cited by examiner

*Primary Examiner* — Rexford Barnie
*Assistant Examiner* — Joseph Lauture
(74) *Attorney, Agent, or Firm* — Ladas & Parry LLP

(57) ABSTRACT

A circuit for calibrating impedance includes an enable signal generator, a code generator and a connection controller. The enable signal generator generates an enable signal in response to a chip selection signal. The code generator generates an impedance calibration code in response to the enable signal by using an external resistance coupled to an electrode. The connection controller controls connection between the code generator and the electrode in response to the enable signal.

16 Claims, 5 Drawing Sheets

FIG.1
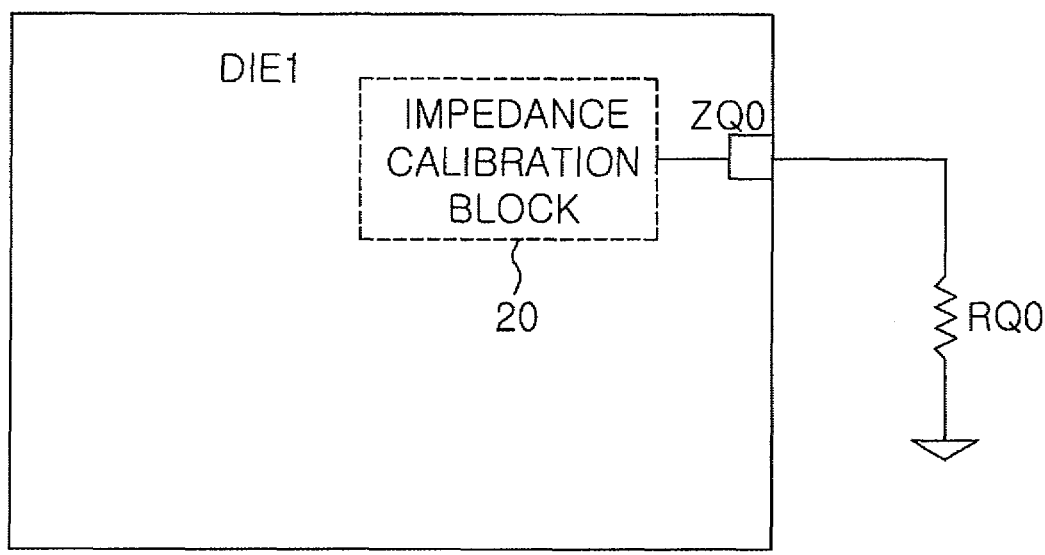
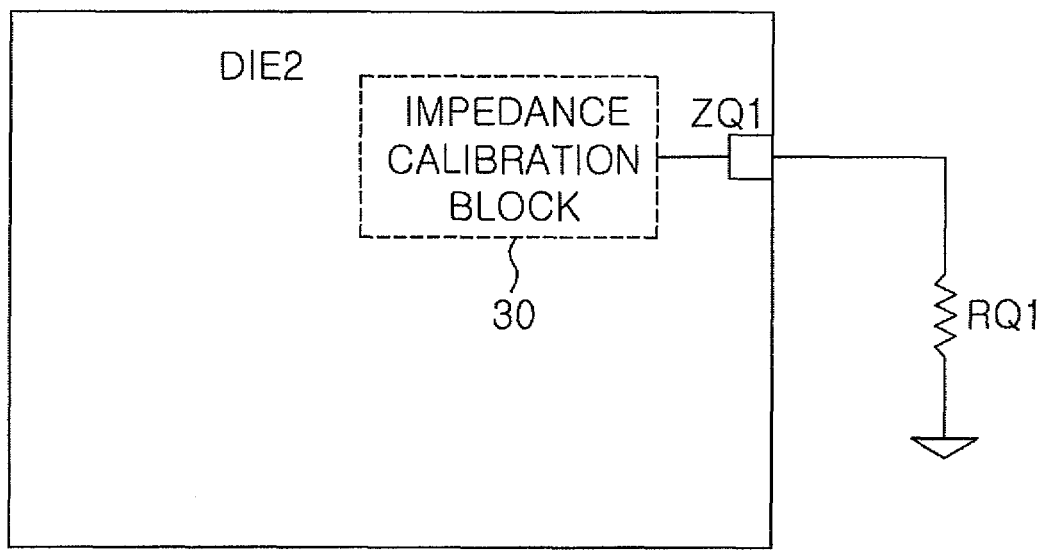

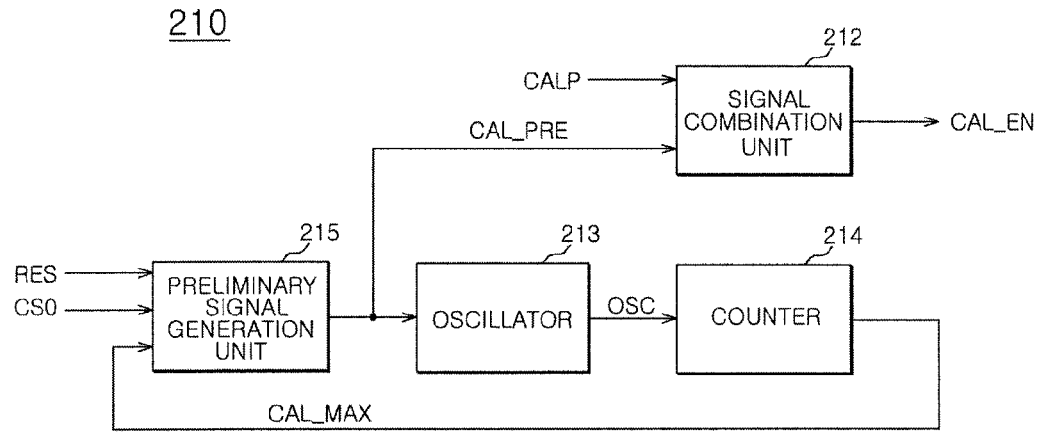
FIG.5
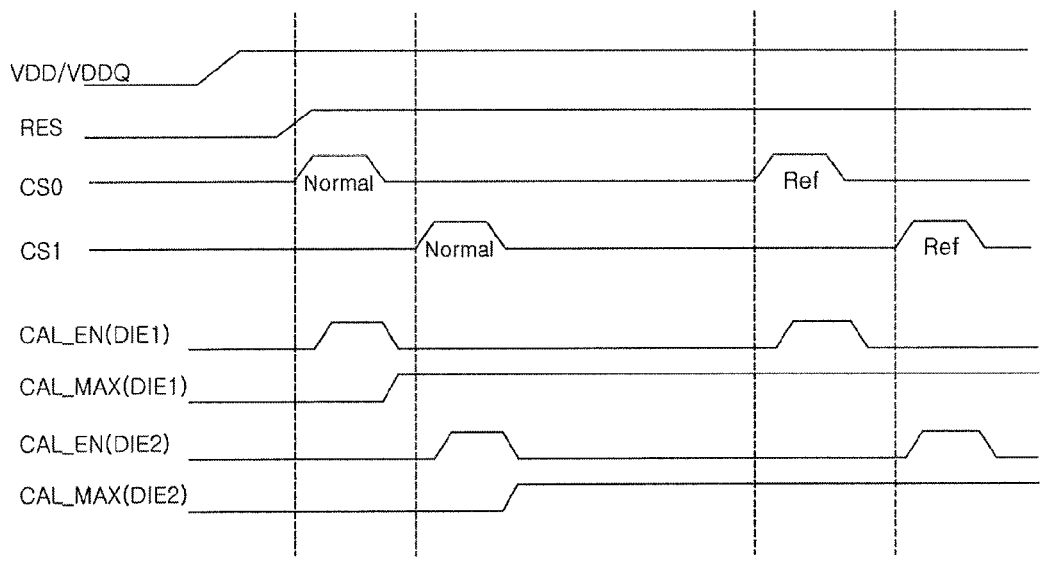

CIRCUIT FOR CALIBRATING IMPEDANCE AND SEMICONDUCTOR APPARATUS USING THE SAME

CROSS-REFERENCES TO RELATED PATENT APPLICATION

The present application claims priority under 35 U.S.C 119(a) to Korean Application No. 10-2009-0058932, filed on Jun. 30, 2009, in the Korean Intellectual Property Office, which is incorporated herein by reference in its entirety as set forth in full.

BACKGROUND

1. Technical Field

Embodiments of the present invention relate generally to semiconductor circuit technology, and more particularly, to a circuit for calibrating impedance and a semiconductor apparatus using the same.

2. Related Art

Semiconductor packaging is a technology used for the purpose of improving the efficiency of integration. A multi-chip package type in which two or more dies (alternatively, referred to as "chip") are packaged is prevalent in semiconductor packaging technology.

Each of the dies of the multi-chip package is an independent component. In a case in which each die is a memory device, such as dynamic random access memory (DRAM), each memory device requires an impedance calibration block designed to perform an operation (hereinafter, referred to as "impedance calibration operation") of accurately matching signal input/output impedance to a target value.

FIG. 1 is a block diagram of a semiconductor apparatus 10 in the related art.

The semiconductor apparatus 10 shown in FIG. 1 includes two dies DIE1 and DIE2.

Impedance calibration block 20 and impedance calibration block 30 are provided in DIE1 and DIE2, respectively.

Each of the impedance calibration blocks 20 and 30 requires a reference resistance having a target impedance value in order to perform the impedance operation.

Process/voltage/temperature (PVT) variation of the die can adversely affect the impedance calibration operation. Therefore, the impedance calibration blocks use resistance arranged outside of the die (hereinafter, referred to as "external resistance") as the reference resistance in order to perform an accurate impedance calibration operation against variation in the process/voltage/temperature (PVT) in the dies.

As shown in FIG. 1, the two dies DIE1 and DIE2 are coupled to separate external resistances RQ0 and RQ1 through external resistance connection electrodes ZQ0 and ZQ1, respectively.

However, a drawback of the semiconductor apparatus configured with external resistance is the increased circuit area occupied by the resistance device and the additional component, such as a line, for connecting the external resistance to its corresponding die, thereby reducing the layout margin available for the semiconductor apparatus.

SUMMARY

Embodiments of the present invention include a circuit for calibrating impedance and a semiconductor apparatus using the same so as to improve layout margin.

In one embodiment, a circuit for calibrating impedance includes: an enable signal generator configured to generate an enable signal in response to a chip selection signal; a code generator configured to generate an impedance calibration code by using an external resistance coupled to an electrode in response to the enable signal; and a connection controller configured to control connection between the code generator and the electrode in response to the enable signal.

In another embodiment, a semiconductor apparatus includes: a first die and a second die including impedance calibration blocks, respectively, wherein electrodes of the first die and the second die for connecting external resistance are coupled to each other, and the impedance calibration block of the first die and the impedance calibration block of the second die perform the impedance calibration operation in response to the chip selection signals, respectively.

In yet another embodiment, a semiconductor apparatus includes: a first die and a second die including impedance calibration blocks, respectively; and a via configured to penetrate the first and second dies to be used as an electrode, wherein external resistance is commonly coupled to the first die and the second die through the via, and an impedance calibration block of the first die and an impedance calibration block of the second die perform an impedance calibration operation in response to chip selection signals, respectively.

These and other features, aspects, and embodiments are described below in the section "Detailed Description."

BRIEF DESCRIPTION OF THE DRAWINGS

Features, aspects, and embodiments are described in conjunction with the attached drawings, in which:

FIG. 1 is a block diagram of a semiconductor apparatus of the related art;

FIG. 4 is a circuit diagram showing one embodiment of the enable signal generator 210 shown in FIG. 3;

FIG. 5 is a diagram shown for illustrating the timing of an impedance calibration operation of an exemplary semiconductor apparatus according to an embodiment of the present invention;

DETAILED DESCRIPTION

Hereinafter, preferred embodiments of the present invention will be described in more detail with reference to the accompanying drawings.

In an embodiment of the present invention different dies share one external resistance for performing an impedance calibration operation. The dies are controlled to perform the impedance calibration operation at different timings by using signals for selecting the dies.

Figure 2:
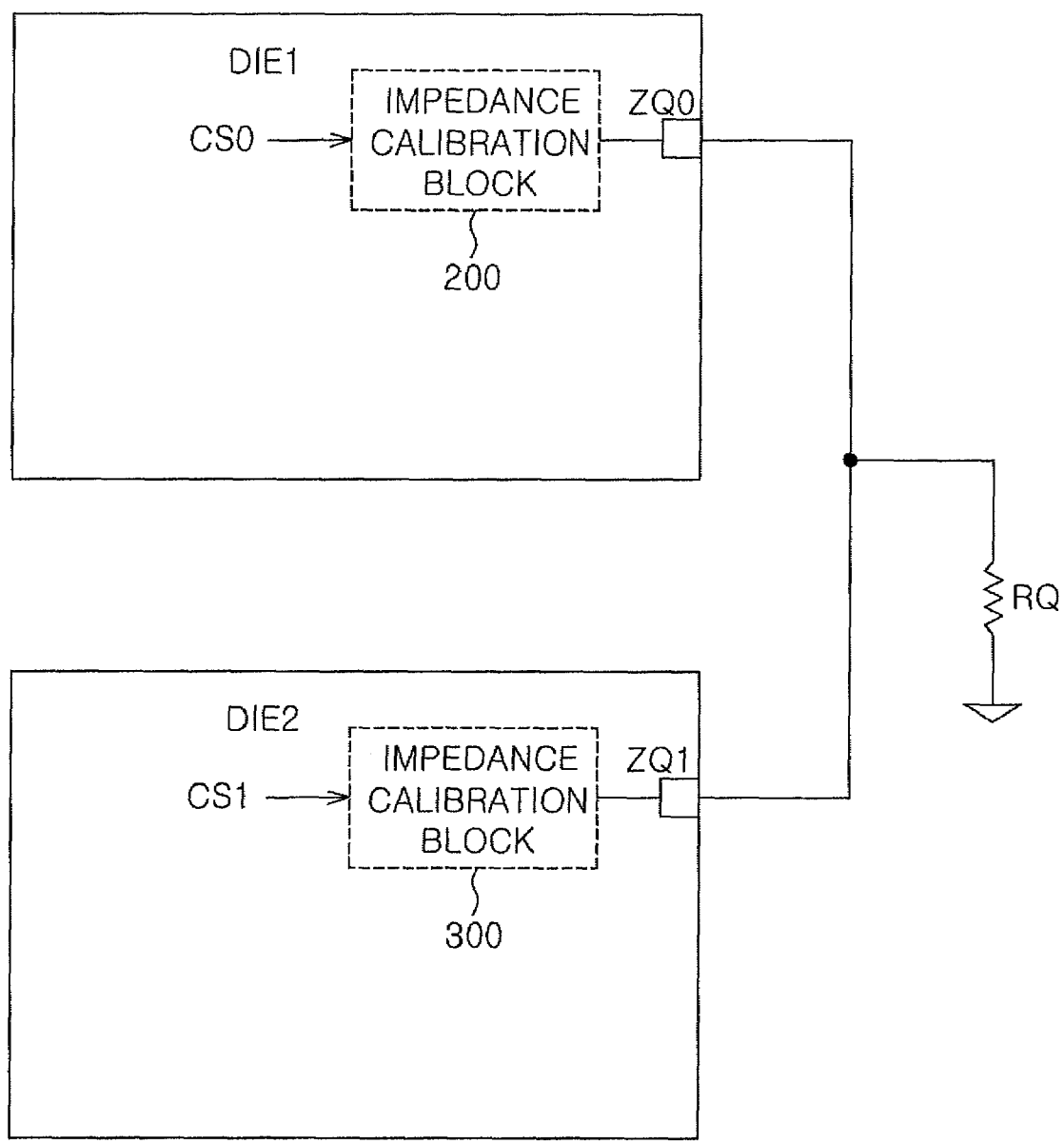
FIG. 2 is a block diagram showing an exemplary semiconductor apparatus 100 according to one embodiment of the present invention.

FIG. 2 is a block diagram of an exemplary semiconductor apparatus 100 according to one embodiment of the present invention.

In the embodiment shown in FIG. 2, the semiconductor apparatus 100 is configured to include two dies DIE1 and DIE2.

In an embodiment, the two dies DIE1 and DIE2 are configured to include impedance calibration blocks 200 and 300, respectively.

As shown in FIG. 2, the impedance calibration blocks 200 and 300 are commonly coupled to the same external resistance RQ through external resistance connection electrodes ZQ0 and ZQ1.

Die selection signals 'CS0' and 'CS1' are provided as inputs to DIE1 and DIE2, respectively. The die selection signals 'CS0' and 'CS1' control the impedance calibration blocks 200 and 300 so that the impedance calibration operation of the respective dies DIE1 and DIE2 are performed at different timings.

Figure 3:
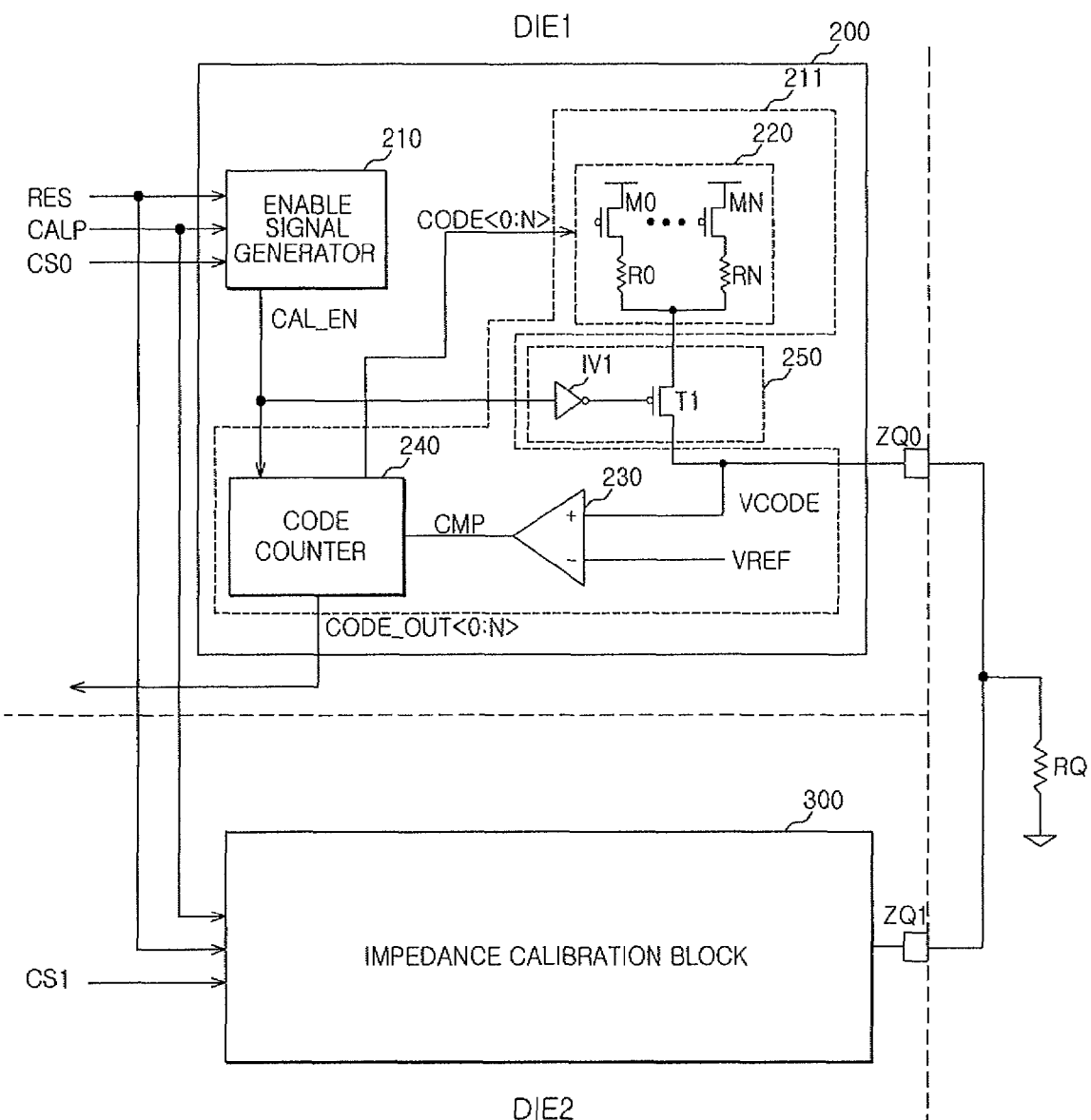
FIG. 3 is a circuit diagram showing exemplary impedance calibration blocks 200 and 300 of FIG. 2 according to an embodiment of the present invention.

FIG. 3 is a circuit diagram of an embodiment of the impedance calibration blocks 200 and 300 shown in FIG. 2.

In the embodiment shown in FIG. 3, the impedance calibration block 200 is configured to include an enable signal generator 210, a code generator 211, and a connection controller 250.

In an embodiment, the impedance calibration block 300 can be configured in the same manner as the impedance calibration block 200.

The enable signal generator 210 is configured to generate an enable signal 'CAL_EN' in response to a system stabilization signal 'RES', a chip selection signal 'CS0', and a refresh recognition signal 'CALP'.

The system stabilization signal 'RES' is a signal for switching the dies DIE1 and DIE2 into an active mode when the power supply voltage is stabilized at a target level in memory controllers such as a graphic processing unit (GPU) and a central processing unit (CPU).

The chip selection signal 'CS0' is a signal indicating whether the die DIE1 has been selected between two dies DIE1 and DIE2. Similarly, the chip signal 'CS1' is a signal indicated whether the die DIE2 has been selected.

The refresh recognition signal 'CALP' is a signal generated by recognizing self refresh or auto refresh.

The code generator 211 is configured to generate, in response to the enable signal 'CAL_EN', an impedance calibration code 'CODE_OUT<0:N>' using the external resistance RQ coupled to the external resistance connection electrode ZQ0.

In an embodiment, the code generator 211 includes a digital/analog converter 220, a comparator 230, and a code counter 240.

The digital/analog converter 220 is configured to convert an internal code 'CODE<0:N>' into code voltage 'VCODE'.

In an embodiment, the digital/analog converter 220 includes legs with the number of legs being the same as the number of bits in the internal code 'CODE<0:N>'. Each leg includes a transistor and a resistor. Thus, in an embodiment, the number of transistors M0 to MN and the number of resistors R0 to RN are each the same as the number of bits in the internal code 'CODE<0:N>.

Internal codes 'CODE<0:N>' are inputted into gates of the transistors of the legs by the bit unit. Thus, a resistance of a leg is selected according to the corresponding bit unit of the internal code 'CODE<0:N>', and therefore the number of selected resistances and the particular resistances that are selected is determined by the internal code 'CODE<0:N>'.

The value of the code voltage 'VCODE' is dependent upon the resistance ratio between the resistance values of resistances selected in the digital/analog converter 220 and a resistance value of the external resistance RQ. For example, when the resistance value resulting from the resistances selected in the digital/analog converter 220 is equal to the resistance value of the external resistance RQ, the code voltage 'V/CODE' is ½ of the power supply voltage of the digital/analog converter 220 (e.g., a voltage divider effect).

The comparator 230 is configured to output a comparison signal 'CMP' by comparing a reference voltage 'VREF' with the code voltage 'VCODE'.

In response to activation of the enable signal 'CAL_EN', the code counter 240 either increases or decreases the internal code 'CODE<0:N>' according to the comparison signal 'CMP', in one embodiment of the code counter 240. The code counter 240 is configured to output the internal code 'CODE<0:N>' as an impedance calibration code 'CODE_OUT<0:N>' at the time at which calibration of the impedance is completed.

At this time, repetitive increase and decrease of the internal code 'CODE<0:N>', which represents the impedance calibration operation, should be completed within a resolution range of the digital/analog converter 220. Accordingly, as the interval code 'CODE<0:N>' repetitively increase and decreases, the code counter 240 is configured to internally determine the completion of calibration and fix the internal code 'CODE<0:N>' to prevent the internal code from being increased or decreased, and thereafter, output the internal code as the impedance calibration code 'CODE_OUT<0:N>'.

The connection controller 250 is configured to electrically separate the impedance calibration block 200 from both the impedance calibration block 300 of the other die DIE2 and the external resistance RQ depending on the enable signal 'CAL_EN'. That is, the connection controller 250 is configured to electrically separate the external resistance connection electrode ZQ0 from the digital/analog converter 220 depending on the enable signal 'CAL_EN'.

In an embodiment, the connection controller 250 includes an inverter IV1 and a transistor T1. The inverter IV1 receives and then inverts the enable signal 'CAL_EN'. The inverted enable signal 'CAL_EN' is input to the gate of the transistor T1. The source of the transistor T1 is coupled to the resistances R0 to RN of the digital/analog converter 220 and the drain of the transistor T1 is coupled to the external resistance RQ through the external resistance connection electrode ZQ.

FIG. 4 is a circuit diagram of one embodiment of the enable signal generator 210 shown in FIG. 3.

In the embodiment shown in FIG. 4, the enable signal generator 210 includes a preliminary signal generation unit 215, a signal combination unit 212, an oscillator 213, and a counter 214.

When the chip selection signal 'CS0' is activated, the preliminary signal generation unit 215 activates a preliminary signal 'CAL_PRE' in accordance with the system stabilization signal 'RES', and deactivates the preliminary signal 'CAL_PRE' in response to a counting limitation signal 'CAL_MAX'. The counting limitation signal 'CAL_MAX' is used for deactivating the enable signal 'CAL_EN' which is generated by the preliminary signal 'CAL_PRE'.

The signal combination unit 212 is configured to generate the enable signal 'CAL_EN' by combining the refresh recognition signal 'CALP' and the preliminary signal 'CAL_PRE'.

The oscillator 213 is configured to generate an oscillator signal 'OSC' in response to activation of the preliminary signal 'CAL_PRE'.

The counter 214 counts the number of pulses of an oscillator signal 'OSC', and when the number of pulses reaches a target counter value, the counter 214 is configured to activate the counting limitation signal 'CAL_MAX'.

The operation of the embodiment of the present invention configured as shown in FIGS. 2 to 4 will be described below with reference to FIGS. 2 to 5. At this time, it is assumed that the dies DIE1 and DIE2 are memory devices, such as DRAM.

In an embodiment, an external system, for example, a memory controller, activates the system stabilization signal 'RES' by recognizing stabilization of power supply voltages 'VDD' and 'VDDQ'.

The memory controller can control performance of the impedance calibration operation for the dies DIE1 and DIE2 after activating the system stabilization signal 'RES'.

At this time, in an embodiment of the present invention, the impedance calibration operation for each of the dies DIE1 and DIE2 is performed at different timings by using the chip selection signals 'CS0' and 'CS1'. That is, once the impedance calibration operation for any one of the dies DIE1 and DIE2 is accomplished, the impedance calibration operation for the other die is performed. An example of performing the impedance calibration operation according to an embodiment of the present invention, in which the order in which the impedance calibration operations are performed is for the die DIE1 and then for the DIE2, will now be described.

As shown in FIG. 5, the chip selection signal 'CS0' is first activated. At this time, the chip selection signal 'CS1' is deactivated. At this time, the impedance calibration operation, which is first performed after the system stabilization signal 'RES' is activated, is performed against a normal state such as a read operation or a write operation.

Because the system stabilization signal 'RES' and the chip selection signal 'CS0' are both activated, an activated preliminary signal 'CAL_PRE' is output by the preliminary signal generation unit 215 shown in FIG. 4.

In an embodiment, the signal combination unit 212 activates the enable signal 'CAL_EN' in response to the activated preliminary signal 'CAL_PRE'.

The oscillator 213 generates the oscillator signal 'OSC' depending upon activation of the preliminary signal 'CAL_PRE'.

In an embodiment, the counter 214 counts the number of pulses of the oscillator signal 'OSC', and when the count value reaches a target counter value, the counter 214 activates the counting limitation signal 'CAL_MAX'.

The signal combination unit 215 deactivates the preliminary signal 'CAL_PRE' when the counting limitation signal 'CAL_MAX' is activated.

The refresh recognition signal 'CALP' maintains a deactivated state so long as the self refresh or auto refresh operations are not performed. When the refresh recognition signal 'CALP' is deactivated, the signal combination unit 212 deactivates the enable signal 'CAL_EN' as the preliminary signal 'CAL_PRE' is deactivated.

The code counter 240 of FIG. 3 performs both increasing and decreasing of the internal code. Whether the internal code 'CODE<0:N>' is increased or decreased is dependent upon the comparison signal 'CMP' when the enable signal 'CAL_EN' is activated.

The connection controller 250 connects the digital/analog converter 220 with the external resistance RQ when the enable signal 'CAL_EN' is activated.

The digital/analog converter 220 converts the internal code 'CODE<0:N>' into the code voltage 'VCODE' and outputs the code voltage 'VCODE' to the comparator 230.

The comparator 230 outputs the comparison signal 'CMP' by comparing the reference voltage 'VREF' to the code voltage 'VCODE'.

The above-mentioned operation is repeated while the enable signal 'CAL_EN' is activated, and once the impedance calibration operation is completed, the impedance calibration code 'CODE_OUT<0:N>' is outputted.

Meanwhile, in the impedance calibration block 300, since the chip selection signal 'CS1' is in the deactivated state, the enable signal 'CAL_EN' maintains the deactivated state, such that the code counter 240 does not operate.

Further, in the impedance calibration block 300, the connection controller 250 can electrically separate the external resistance connection electrode ZQ1 from the digital/analog converter 220 because the enable signal 'CAL_EN' is in the deactivated state.

Therefore, when the impedance calibration block 200 performs the impedance calibration operation, the impedance calibration block 300 does not operate and its resistance is not coupled to the external resistance connection electrode ZQ0.

As such, after the impedance calibration of the impedance calibration block 200 is completed, the impedance calibration operation of the impedance calibration block 300 is performed by deactivating the chip selection signal 'CS0' and activating the chip selection signal 'CS1'.

The impedance calibration operation of the impedance calibration block 300 is performed in the same manner as the impedance calibration operation of the impedance calibration block 200. At this time, the connection controller 250 of the impedance calibration block 200 can electrically separate the external resistance connection electrode ZQ0 from the digital/analog converter 220.

Therefore, when the impedance calibration block 300 performs the impedance calibration operation, the impedance calibration block 200 does not operate and its resistance is not coupled to the external resistance connection electrode ZQ1.

Meanwhile, as shown in FIG. 5, after the counting limitation signal CAL_MAX is activated, the impedance calibration operation is performed by the refresh recognition signal 'CALP', which is activated depending on self refresh or auto refresh.

Even in this case, of course, the chip selection signals 'CS0' and 'CS1' are sequentially activated; and as a result, the impedance calibration operations for the impedance calibration block 200 of the die DIE1 and the impedance calibration block 300 of the die DIE2 are sequentially performed.

The impedance calibration operated depending upon the refresh operation is performed in the same manner as the impedance calibration operated according to the above-mentioned normal operation. However, since activation sections of the refresh recognition signal 'CALP' and the preliminary signal 'CAL_PRE' are different from each other, there may be a difference in the activation section of the enable signal 'CAL_EN'.

That is, the impedance calibration time performed in the normal operation and the impedance calibration time depending on the refresh operation may be different from each other.

Figure 6:
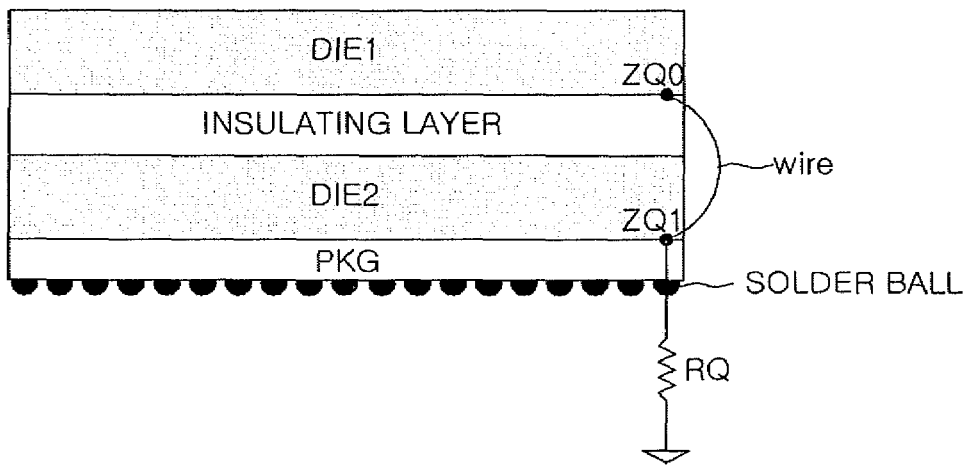
FIG. 6 is a diagram showing the structure of an exemplary semiconductor apparatus 101 implemented in a dual die package (DDP) form according to one embodiment of the present invention.

FIG. 6 is a diagram showing the structure of an exemplary semiconductor apparatus 101 implemented in a dual die package (DDP) form according to one embodiment of the present invention.

The embodiment of the present invention described with reference to FIGS. 2 to 5 can be applied to the dual die package form as shown in FIG. 6.

Since the dual die package does not have extra space for electrode allocation, the impedance calibration function cannot be applied to the dual die package if too much space for the impedance calibration function is required.

However, in the embodiment of the present invention, since different dies DIE1 and DIE2 can share one external resistance RQ, the embodiment can be applied to the dual die package as shown in FIG. 6.

In the dual die package, only one external resistance RQ is formed and only one solder ball outside the package PKG is allotted to connect the external resistance RQ to different dies DIE1 and DIE2. In the embodiment shown in FIG. 6, only two dies are shown; however, the present invention can be applied regardless of the number of dies.

Figure 7:
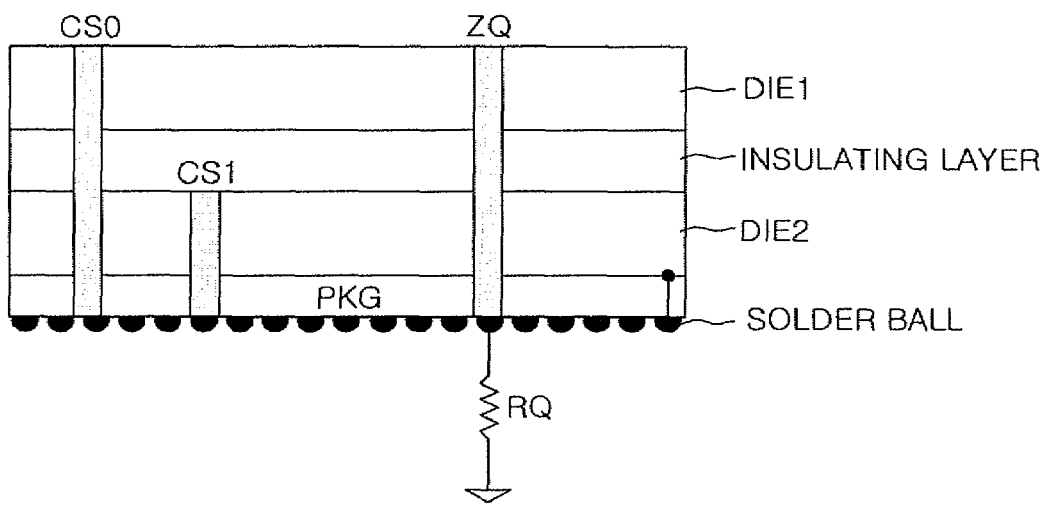
FIG. 7 is a diagram showing the structure of an exemplary semiconductor apparatus 102 implemented in a through silicon via form according to one embodiment of the present invention.

FIG. 7 is a diagram showing the structure of an exemplary semiconductor apparatus 102 implemented in a TSV (through silicon via) form according to one embodiment of the present invention.

The through silicon via scheme is a scheme forming which the electrode is formed by making a hole in the silicon wafer. The TSV scheme has an excellent effect in high-speed input/output signal processing and increase in the number of signal channels.

Referring to FIGS. 2 to 5, the embodiment of the present invention can be applied even to the through silicon via form as shown in FIG. 7.

In the embodiment of the present invention, the different dies DIE1 and DIE2 can share one external resistance RQ. Therefore, as shown in FIG. 7, in the case in which the through silicon via form is utilized, only one via for the external resistance connection electrode ZQ is required. Therefore, a process can be simplified and utilization of a layout aspect is increased.

In embodiments of the present invention, since only one via is formed regardless of the number of dies, the embodiment is not limited to the embodiment of FIG. 7 in which only two dies DIE1 and DIE2 are disposed, and can be applied regardless of the number of dies.

While certain embodiments have been described above, it will be understood to those skilled in the art that the embodiments described are by way of example only. Accordingly, the apparatus described herein should not be limited based on the described embodiments. Rather, the devices and methods described herein should only be limited in light of the claims that follow when taken in conjunction with the above description and accompanying drawings.

What is claimed is:

1. A circuit for calibrating impedance, comprising:
an enable signal generator configured to generate an enable signal in response to a chip selection signal;
a code generator configured to generate an impedance calibration code in response to the enable signal, wherein the code generator uses an external resistance coupled to an electrode to generate the impedance calibration code; and
a connection controller configured to electrically connect or disconnect the code generator with the electrode in response to the enable signal.

2. The circuit of claim 1, wherein the enable signal generator is configured to activate the enable signal in response to activation of a signal for switching a die into an active mode and activation of the chip selection signal.

3. The circuit of claim 1, wherein the code generator comprises:
a digital/analog converter configured to convert an internal code into code voltage;
a comparator configured to output a comparison signal by comparing a reference voltage with the code voltage; and
a code counter configured to be responsive to activation of the enable signal in order to increase or decrease the internal code depending on the comparison signal.

4. The circuit of claim 1, wherein the enable signal generator comprises:
a preliminary signal generation unit configured to generate a preliminary signal in response to the chip selection signal and a counting limitation signal;
an oscillator configured to generate an oscillator signal in response to the preliminary signal;
a counter configured to count a number of pulses of the oscillator signal and activating the counting limitation signal when the number reaches a target counter value, wherein the preliminary signal generating unit deactivates the preliminary signal in response to the activated counting limitation signal
a signal combination unit configured to generate the enable signal in response to the preliminary signal and a refresh recognition signal.

5. A semiconductor apparatus, comprising:
a first die and a second die each including an impedance calibration block and each having an electrode connecting the respective first and second dies to an external resistance,
wherein the electrodes of the first die and the second die for connecting external resistance are coupled to each other, and
the impedance calibration block of the first die and the impedance calibration block of the second die each perform an impedance calibration operation in response to a chip selection signal.

6. The semiconductor apparatus of claim 5, wherein the impedance blocks of the first and second dies are configured such that when an impedance calibration block is not selected between the impedance calibration block of the first die and the impedance calibration block of the second die, the not selected impedance block is electrically separated from the corresponding electrode.

7. The semiconductor apparatus of claim 5, wherein the impedance calibration block of any one of the first and second dies comprises:
an enable signal generator configured to generate an enable signal in response to the chip selection signal; and
a code generator configured to generate an impedance calibration code in response to the enable signal.

8. The semiconductor apparatus of claim 7, wherein the code generator comprises:
a digital/analog converter configured to convert an internal code into code voltage;
a comparator configured to output a comparison signal by comparing a reference voltage with the code voltage; and
a code counter configured to be responsive to activation of the enable signal in order to increase or decrease the internal code depending on the comparison signal.

9. A semiconductor apparatus, comprising:
a first die and a second die each including an impedance calibration block;
a via penetrating each of the first and second dies;

an external resistance commonly coupled to the first die and the second die through the via; and an impedance calibration block of the first die and an impedance calibration block of the second die, wherein each of the impedance calibration blocks of the first and second dies perform an impedance calibration operation in response to a chip selection signal.

10. The semiconductor apparatus of claim 9, wherein the impedance calibration block of any one of the first and second dies comprises:

an enable signal generator configured to generate the enable signal in response to the chip selection signal; and a code generator configured to generate an impedance calibration code in response to the enable signal.

11. The semiconductor apparatus of claim 10, wherein the code generator includes:

a digital/analog converter configured to convert an internal code into code voltage;

a comparator configured to output a comparison signal by comparing a reference voltage with the code voltage; and a code counter configured to be responsive to activation of the enable signal in order to increase or decrease the internal code depending on the comparison signal.

12. A semiconductor apparatus for calibrating impedance, the semiconductor apparatus comprising:

an external resistance;

a plurality of dies commonly coupled to the external resistance, each die of the plurality of dies including an impedance calibration block;

wherein the impedance calibration blocks are each configured to be responsive to a chip selection signal such that the impedance calibration blocks perform impedance calibrations at different timings from one another.

13. The semiconductor apparatus of claim 12, wherein the impedance calibration block of any one of the plurality of dies comprises:

an enable signal generator configured to generate an enable signal in response to the chip selection signal; and a code generator configured to generate an impedance calibration code in response to the enable signal.

14. The semiconductor apparatus of claim 13, wherein the impedance block further comprises a connection controller configured to electrically separate the impedance calibration block from the external resistance in response to the enable signal.

15. The semiconductor apparatus of claim 13, wherein the code generator comprises:

a digital/analog converter configured to convert an internal code into code voltage;

a comparator configured to output a comparison signal by comparing a reference voltage with the code voltage; and a code counter configured to be responsive to activation of the enable signal in order to increase or decrease the internal code depending on the comparison signal.

16. The semiconductor apparatus of claim 13, wherein the enable signal generator comprises:

a preliminary signal generation unit configured to generate a preliminary signal in response to the chip selection signal and a counting limitation signal;

an oscillator configured to generate an oscillator signal in response to the preliminary signal;

a counter configured to count a number of pulses of the oscillator signal and activating the counting limitation signal when the number reaches a target counter value, wherein the preliminary signal generating unit deactivates the preliminary signal in response to the activated counting limitation signal; and a signal combination unit configured to generate the enable signal in response to the preliminary signal and a refresh recognition signal.

* * * * *